US009929325B2

(12) United States Patent
Mahan et al.

(10) Patent No.: US 9,929,325 B2
(45) Date of Patent: Mar. 27, 2018

(54) LIGHTING DEVICE INCLUDING QUANTUM DOTS

(71) Applicant: SAMSUNG ELECTRONICS CO., LTD., Suwon-si (KR)

(72) Inventors: Gagan Mahan, Watertown, MA (US); Peter T. Kazlas, Sudbury, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/910,788

(22) Filed: Jun. 5, 2013

(65) Prior Publication Data

US 2014/0021440 A1    Jan. 23, 2014

Related U.S. Application Data

(60) Provisional application No. 61/655,789, filed on Jun. 5, 2012.

(51) Int. Cl.

| *F21K 9/61* | (2016.01) |
| *H01L 33/58* | (2010.01) |
| *F21S 6/00* | (2006.01) |
| *F21V 8/00* | (2006.01) |
| *F21Y 103/00* | (2016.01) |
| *F21Y 115/10* | (2016.01) |

(52) U.S. Cl.
CPC ............... *H01L 33/58* (2013.01); *F21S 6/00* (2013.01); *G02B 6/0003* (2013.01); *F21K 9/61* (2016.08); *F21Y 2103/00* (2013.01); *F21Y 2115/10* (2016.08)

(58) Field of Classification Search
CPC .............. H01L 33/48–33/62; F21K 9/61–9/64
USPC ................... 257/13, 99; 362/84, 217.01, 618
See application file for complete search history.

(56) References Cited

U.S. PATENT DOCUMENTS

| 2,028,241 A | 1/1936 | Paul |
| 3,248,588 A | 4/1966 | Blazek et al. |
| 3,510,732 A | 5/1970 | Amans et al. |
| 3,774,086 A | 11/1973 | Vincent, Jr. |
| 3,825,792 A | 7/1974 | Rokosz et al. |
| 2,875,456 A | 4/1975 | Kano et al. |
| 4,035,686 A | 7/1977 | Fleming |
| 4,082,889 A | 4/1978 | Distefano |
| 4,130,343 A | 12/1978 | Miller et al. |

(Continued)

FOREIGN PATENT DOCUMENTS

| CN | 1945099 A | 4/2007 |
| CN | 101806404 A | 8/2010 |

(Continued)

OTHER PUBLICATIONS

Dabbousi, et al., "(CdSe) ZnS Core-Shell Quantum Dots: Synthesis and Characterizaqtion of a Size Series of Highly Luminescent Nanocrystallites", *J. Phys. Chem.* (1997) 101, 9463.

(Continued)

*Primary Examiner* — Stephen Bradley
(74) *Attorney, Agent, or Firm* — Cantor Colburn LLP

(57) ABSTRACT

A lighting device including an emissive material comprising quantum dots and a liquid medium disposed within a sealed container with at least a portion of a light guiding member disposed within the sealed container. Products including a lighting device in accordance with the invention are also disclosed.

25 Claims, 6 Drawing Sheets

(56) References Cited

U.S. PATENT DOCUMENTS

| | | | |
|---|---|---|---|
| 4,366,407 A | 12/1982 | Walsh | |
| 4,377,750 A | 3/1983 | Pape et al. | |
| 4,382,272 A | 5/1983 | Quella et al. | |
| 4,608,301 A | 8/1986 | Ishizuka et al. | |
| 4,719,386 A | 1/1988 | Toho | |
| 4,766,526 A | 8/1988 | Morimoto et al. | |
| 4,772,885 A | 9/1988 | Uehara et al. | |
| 4,780,752 A | 10/1988 | Angerstein et al. | |
| 4,820,016 A | 4/1989 | Cohen et al. | |
| 4,902,567 A | 2/1990 | Eilersten et al. | |
| 4,929,053 A | 5/1990 | Muller-Stute et al. | |
| 4,931,692 A | 6/1990 | Tagaki et al. | |
| 5,064,718 A | 11/1991 | Buscall et al. | |
| 5,077,147 A | 12/1991 | Tanaka et al. | |
| 5,208,462 A | 5/1993 | O'Conner et al. | |
| 5,260,957 A | 11/1993 | Hakimi et al. | |
| 5,293,050 A | 3/1994 | Chapple-Sokol et al. | |
| 5,294,870 A | 3/1994 | Tang et al. | |
| 5,354,707 A | 10/1994 | Chapple-Sokol et al. | |
| 5,422,489 A | 6/1995 | Bhargava | |
| 5,434,878 A | 7/1995 | Lawandy | |
| 5,442,254 A | 8/1995 | Jaskie | |
| 5,448,582 A | 9/1995 | Lawandy | |
| 5,455,489 A | 10/1995 | Bhargava | |
| 5,470,910 A | 11/1995 | Spanhel et al. | |
| 5,482,890 A | 1/1996 | Liu et al. | |
| 5,504,661 A | 4/1996 | Szpak | |
| 5,527,386 A | 6/1996 | Statz | |
| 5,534,056 A | 7/1996 | Kuehnie et al. | |
| 5,537,000 A | 7/1996 | Alivisatos et al. | |
| 5,586,879 A | 12/1996 | Szpak | |
| 5,599,897 A | 2/1997 | Nishiguchi et al. | |
| 5,677,545 A | 10/1997 | Shi et al. | |
| 5,881,200 A | 3/1999 | Burt | |
| 5,882,779 A | 3/1999 | Lawandy | |
| 6,066,861 A | 5/2000 | Hohn et al. | |
| 6,151,347 A | 11/2000 | Noel et al. | |
| 6,239,449 B1 | 5/2001 | Fafard et al. | |
| 6,259,506 B1 | 7/2001 | Lawandy | |
| 6,294,401 B1 | 9/2001 | Jacobson et al. | |
| 6,319,426 B1 | 11/2001 | Bawendi et al. | |
| 6,322,901 B1 | 11/2001 | Bawendi et al. | |
| 6,464,898 B1 | 10/2002 | Tomoike et al. | |
| 6,501,091 B1 | 12/2002 | Bawendi et al. | |
| 6,515,314 B1 | 2/2003 | Duggal et al. | |
| 6,576,291 B2 | 6/2003 | Bawendi et al. | |
| 6,608,439 B1 | 8/2003 | Sokolik et al. | |
| 6,650,044 B1 | 11/2003 | Lowery | |
| 6,714,711 B1 | 3/2004 | Lieberman et al. | |
| 6,801,270 B2 | 10/2004 | Faris et al. | |
| 6,819,692 B2 | 11/2004 | Klimov et al. | |
| 6,890,078 B2 | 5/2005 | Koide | |
| 7,045,825 B2 | 5/2006 | Kahen et al. | |
| 7,065,285 B2 | 6/2006 | Chen et al. | |
| 7,132,297 B2 | 11/2006 | Griglione et al. | |
| 7,166,010 B2 | 1/2007 | Lamansky et al. | |
| 7,273,309 B2 | 9/2007 | Ford et al. | |
| 7,279,716 B2 | 10/2007 | Chen | |
| 7,279,832 B2 | 10/2007 | Thurk et al. | |
| 7,294,861 B2 | 11/2007 | Schardt et al. | |
| 7,321,193 B2 | 1/2008 | Antoniadis et al. | |
| 7,326,365 B2 | 2/2008 | Bawendi et al. | |
| 7,326,908 B2 | 2/2008 | Sargent et al. | |
| 7,350,933 B2 | 4/2008 | Ng et al. | |
| 7,361,413 B2 | 4/2008 | Kinlen | |
| 7,374,807 B2 | 5/2008 | Parce et al. | |
| 7,393,618 B2 | 7/2008 | Ioka et al. | |
| 7,420,323 B2 | 9/2008 | Krummacher | |
| 7,430,355 B2 | 9/2008 | Heikenfeld et al. | |
| 7,462,502 B2 | 12/2008 | Paolini et al. | |
| 7,473,922 B2 | 1/2009 | Uchiyama et al. | |
| 7,481,562 B2 | 1/2009 | Chua et al. | |
| 7,495,383 B2 | 2/2009 | Chua et al. | |
| 7,497,581 B2 | 3/2009 | Beeson et al. | |
| 7,513,669 B2 | 4/2009 | Chua et al. | |
| 7,560,747 B2 | 7/2009 | Cok | |
| 7,560,859 B2 | 7/2009 | Saito et al. | |
| 7,564,067 B2 | 7/2009 | Cok | |
| 7,595,508 B2 | 9/2009 | Otsubo et al. | |
| 7,679,102 B2 | 3/2010 | Chik et al. | |
| 7,722,422 B2 | 5/2010 | Cok | |
| 7,732,237 B2 | 6/2010 | Xie | |
| 7,819,549 B2* | 10/2010 | Narendran et al. | 362/228 |
| 7,880,377 B2 | 2/2011 | Orita et al. | |
| 8,044,382 B2 | 10/2011 | Yokoyama et al. | |
| 8,084,934 B2 | 12/2011 | Kim et al. | |
| 8,089,061 B2 | 1/2012 | Kobayashi et al. | |
| 8,120,239 B2 | 2/2012 | Cheon et al. | |
| 8,128,272 B2 | 3/2012 | Fine et al. | |
| 8,264,777 B2 | 9/2012 | Skipor et al. | |
| 8,330,348 B2 | 12/2012 | Berben et al. | |
| 8,642,977 B2 | 2/2014 | Comerford et al. | |
| 8,718,437 B2 | 5/2014 | Coe-Sullivan et al. | |
| 9,025,416 B2* | 5/2015 | Millar | G01S 13/46 367/127 |
| 9,028,082 B2* | 5/2015 | Yoo | G02B 6/4298 362/230 |
| 9,212,056 B2 | 12/2015 | Breen et al. | |
| 9,297,092 B2 | 3/2016 | Breen et al. | |
| 2001/0001207 A1 | 5/2001 | Shimizu et al. | |
| 2001/0028055 A1 | 10/2001 | Fafard et al. | |
| 2002/0053359 A1 | 5/2002 | Harman et al. | |
| 2002/0071948 A1 | 6/2002 | Duff et al. | |
| 2002/0127224 A1 | 9/2002 | Chen et al. | |
| 2002/0136932 A1 | 9/2002 | Yoshida | |
| 2002/0186921 A1 | 12/2002 | Schumacher et al. | |
| 2002/0197764 A1 | 12/2002 | Uemura et al. | |
| 2003/0030706 A1 | 2/2003 | Jagannathan et al. | |
| 2003/0034486 A1 | 2/2003 | Korgel | |
| 2003/0151700 A1 | 8/2003 | Carter et al. | |
| 2003/0156425 A1 | 8/2003 | Turnbull et al. | |
| 2003/0160260 A1 | 8/2003 | Hirai et al. | |
| 2003/0164505 A1 | 9/2003 | Streubel et al. | |
| 2003/0227249 A1 | 12/2003 | Mueller et al. | |
| 2003/0230970 A1 | 12/2003 | Steckl et al. | |
| 2004/0004433 A1 | 1/2004 | Lamansky et al. | |
| 2004/0007169 A1 | 1/2004 | Ohtsu et al. | |
| 2004/0012958 A1 | 1/2004 | Hashimoto et al. | |
| 2004/0023010 A1 | 2/2004 | Blovic et al. | |
| 2004/0135495 A1 | 7/2004 | Wu et al. | |
| 2004/0233139 A1 | 11/2004 | Asano et al. | |
| 2004/0245912 A1 | 12/2004 | Thurk et al. | |
| 2004/0259363 A1 | 12/2004 | Bawendi et al. | |
| 2004/0262583 A1 | 12/2004 | Lee | |
| 2005/0012076 A1 | 1/2005 | Morioka | |
| 2005/0051777 A1 | 3/2005 | Hill et al. | |
| 2005/0062395 A1 | 3/2005 | Takahashi et al. | |
| 2005/0088079 A1 | 4/2005 | Daniels | |
| 2005/0088380 A1 | 4/2005 | Bulovic et al. | |
| 2005/0093422 A1 | 5/2005 | Wang et al. | |
| 2005/0093430 A1 | 5/2005 | Ibetson et al. | |
| 2005/0098787 A1 | 5/2005 | Andrews | |
| 2005/0134723 A1 | 6/2005 | Lee et al. | |
| 2005/0135079 A1 | 6/2005 | Yin Chua et al. | |
| 2005/0139852 A1 | 6/2005 | Chen et al. | |
| 2005/0180680 A1 | 8/2005 | Kong | |
| 2005/0214967 A1 | 9/2005 | Scher et al. | |
| 2005/0236556 A1 | 10/2005 | Sargent et al. | |
| 2005/0261400 A1 | 11/2005 | Yang et al. | |
| 2005/0179915 A1 | 12/2005 | Elofson | |
| 2005/0265404 A1 | 12/2005 | Ashdown | |
| 2005/0271548 A1 | 12/2005 | Yang et al. | |
| 2005/0272159 A1 | 12/2005 | Ismagilov et al. | |
| 2005/0275615 A1 | 12/2005 | Kahen et al. | |
| 2005/0279949 A1 | 12/2005 | Oldham et al. | |
| 2006/0001036 A1 | 1/2006 | Jacob et al. | |
| 2006/0002101 A1 | 1/2006 | Wheatley | |
| 2006/0003097 A1 | 1/2006 | Andres et al. | |
| 2006/0003114 A1 | 1/2006 | Enlow et al. | |
| 2006/0003156 A1 | 1/2006 | Masutan et al. | |
| 2006/0011923 A1 | 1/2006 | Eisert et al. | |
| 2006/0024525 A1 | 2/2006 | Jeong et al. | |
| 2006/0034065 A1 | 2/2006 | Thurk | |
| 2006/0043361 A1 | 3/2006 | Lee et al. | |

(56) References Cited

U.S. PATENT DOCUMENTS

| | | |
|---|---|---|
| 2006/0057460 A1 | 3/2006 | Matthias et al. |
| 2006/0060862 A1 | 3/2006 | Bawendi et al. |
| 2006/0063029 A1 | 3/2006 | Jang et al. |
| 2006/0063289 A1 | 3/2006 | Negley et al. |
| 2006/0065902 A1 | 3/2006 | Todori et al. |
| 2006/0066210 A1 | 3/2006 | Ng et al. |
| 2006/0068154 A1 | 3/2006 | Parce et al. |
| 2006/0081862 A1 | 4/2006 | Chua et al. |
| 2006/0097264 A1 | 5/2006 | Kim et al. |
| 2006/0103589 A1 | 5/2006 | Chua et al. |
| 2006/0105483 A1 | 5/2006 | Leatherdale et al. |
| 2006/0145599 A1 | 7/2006 | Stegamat et al. |
| 2006/0147703 A1 | 7/2006 | Walker et al. |
| 2006/0152150 A1 | 7/2006 | Boerner et al. |
| 2006/0157686 A1 | 7/2006 | Jang et al. |
| 2006/0157717 A1 | 7/2006 | Nagai et al. |
| 2006/0157720 A1 | 7/2006 | Bawendi et al. |
| 2006/0169971 A1 | 8/2006 | Cho et al. |
| 2006/0196375 A1 | 9/2006 | Coe-Sullivan et al. |
| 2006/0197437 A1 | 9/2006 | Krummacher et al. |
| 2006/0199886 A1 | 9/2006 | Ryang |
| 2006/0202219 A1 | 9/2006 | Ohashi et al. |
| 2006/0204676 A1 | 9/2006 | Jones et al. |
| 2006/0204679 A1 | 9/2006 | Jones et al. |
| 2006/0210726 A1 | 9/2006 | Jones et al. |
| 2006/0214903 A1 | 9/2006 | Kurosaka |
| 2006/0215958 A1 | 9/2006 | Yeo et al. |
| 2006/0221021 A1 | 10/2006 | Hajjar et al. |
| 2006/0227546 A1 | 10/2006 | Yeo et al. |
| 2006/0232725 A1 | 10/2006 | Chua et al. |
| 2006/0238103 A1 | 10/2006 | Choi et al. |
| 2006/0238671 A1 | 10/2006 | Kim et al. |
| 2006/0244367 A1 | 11/2006 | Im et al. |
| 2006/0245710 A1 | 11/2006 | Borrelli et al. |
| 2006/0255711 A1 | 11/2006 | Dejima et al. |
| 2006/0266640 A1 | 11/2006 | Halsey et al. |
| 2006/0274226 A1 | 12/2006 | Im et al. |
| 2006/0279296 A1 | 12/2006 | Lee et al. |
| 2007/0012928 A1 | 1/2007 | Peng et al. |
| 2007/0012941 A1 | 1/2007 | Cheon |
| 2007/0013996 A1 | 1/2007 | Verma |
| 2007/0014318 A1 | 1/2007 | Hajjar et al. |
| 2007/0018102 A1 | 1/2007 | Braune et al. |
| 2007/0018558 A1 | 1/2007 | Chua et al. |
| 2007/0034833 A1 | 2/2007 | Parce et al. |
| 2007/0036510 A1 | 2/2007 | Ingman et al. |
| 2007/0036962 A1 | 2/2007 | Sasaki et al. |
| 2007/0045777 A1 | 3/2007 | Gillies et al. |
| 2007/0069288 A1 | 3/2007 | Takeda et al. |
| 2007/0077594 A1 | 4/2007 | Hikmet et al. |
| 2007/0079927 A1 | 4/2007 | Lamansky et al. |
| 2007/0085092 A1 | 4/2007 | Chen et al. |
| 2007/0087197 A1 | 4/2007 | Jang et al. |
| 2007/0090755 A1 | 4/2007 | Eida et al. |
| 2007/0096078 A1 | 5/2007 | Lee et al. |
| 2007/0096634 A1 | 5/2007 | Krummacher et al. |
| 2007/0103068 A1 | 5/2007 | Bawendi et al. |
| 2007/0108888 A1 | 5/2007 | Chen et al. |
| 2007/0112101 A1 | 5/2007 | Choi et al. |
| 2007/0112118 A1 | 5/2007 | Park et al. |
| 2007/0115995 A1 | 5/2007 | Kim et al. |
| 2007/0121129 A1 | 5/2007 | Eida et al. |
| 2007/0131905 A1 | 6/2007 | Sato et al. |
| 2007/0131954 A1 | 6/2007 | Murayama et al. |
| 2007/0145350 A1 | 6/2007 | Kobori |
| 2007/0154735 A1 | 7/2007 | Nakayama |
| 2007/0164661 A1 | 7/2007 | Kuma |
| 2007/0170418 A1 | 7/2007 | Bowers et al. |
| 2007/0170447 A1 | 7/2007 | Negley et al. |
| 2007/0177380 A1 | 8/2007 | Schultz et al. |
| 2007/0190675 A1 | 8/2007 | Yamazaki et al. |
| 2007/0200492 A1 | 8/2007 | Cok et al. |
| 2007/0201056 A1 | 8/2007 | Cok et al. |
| 2007/0223219 A1 | 9/2007 | Medendorp et al. |
| 2007/0235751 A1 | 10/2007 | Radkov et al. |
| 2007/0241661 A1 | 10/2007 | Yin |
| 2007/0247061 A1 | 10/2007 | Adamovich et al. |
| 2007/0263408 A1 | 11/2007 | Chua et al. |
| 2007/0281140 A1 | 12/2007 | Haubrich et al. |
| 2007/0298160 A1 | 12/2007 | Jang et al. |
| 2008/0001124 A1 | 1/2008 | Hachiya et al. |
| 2008/0001167 A1 | 1/2008 | Coe-Sullivan et al. |
| 2008/0001528 A1 | 1/2008 | Eida |
| 2008/0007156 A1 | 1/2008 | Gibson et al. |
| 2008/0012031 A1 | 1/2008 | Jang et al. |
| 2008/0012471 A1 | 1/2008 | Cok |
| 2008/0029710 A1 | 2/2008 | Sekiya et al. |
| 2008/0036367 A1 | 2/2008 | Eida et al. |
| 2008/0042552 A1 | 2/2008 | Cok |
| 2008/0048936 A1 | 2/2008 | Powell et al. |
| 2008/0054803 A1 | 3/2008 | Zheng et al. |
| 2008/0057342 A1 | 3/2008 | Sekiya |
| 2008/0070153 A1 | 3/2008 | Ioku et al. |
| 2008/0074050 A1 | 3/2008 | Chen et al. |
| 2008/0116784 A1 | 5/2008 | Krummacher et al. |
| 2008/0117500 A1 | 5/2008 | Narendran et al. |
| 2008/0135914 A1 | 6/2008 | Krishna et al. |
| 2008/0144333 A1 | 6/2008 | Gourlay |
| 2008/0165235 A1 | 7/2008 | Rolly et al. |
| 2008/0169753 A1 | 7/2008 | Skipor et al. |
| 2008/0172197 A1 | 7/2008 | Skipor et al. |
| 2008/0173886 A1 | 7/2008 | Cheon et al. |
| 2008/0180020 A1 | 7/2008 | Cok |
| 2008/0218068 A1 | 9/2008 | Cok |
| 2008/0237540 A1 | 10/2008 | Dubrow |
| 2008/0237611 A1 | 10/2008 | Cok et al. |
| 2008/0254210 A1 | 10/2008 | Lai et al. |
| 2008/0273562 A1 | 11/2008 | Hasegawa et al. |
| 2008/0277626 A1 | 11/2008 | Hasegawa et al. |
| 2008/0278063 A1 | 11/2008 | Cok |
| 2008/0297028 A1 | 12/2008 | Kane et al. |
| 2008/0297029 A1 | 12/2008 | Cok |
| 2008/0308825 A1 | 12/2008 | Chakraborty et al. |
| 2009/0001385 A1 | 1/2009 | Skipor et al. |
| 2009/0002806 A1 | 1/2009 | Skipor et al. |
| 2009/0017268 A1 | 1/2009 | Skipor et al. |
| 2009/0021148 A1 | 1/2009 | Hachiya et al. |
| 2009/0034292 A1 | 2/2009 | Pokrovskiy et al. |
| 2009/0050907 A1 | 2/2009 | Yuan et al. |
| 2009/0057662 A1 | 3/2009 | Brazos et al. |
| 2009/0059554 A1 | 3/2009 | Skipor et al. |
| 2009/0152567 A1 | 6/2009 | Comerford et al. |
| 2009/0162011 A1 | 6/2009 | Coe-Sullivan et al. |
| 2009/0174022 A1 | 7/2009 | Coe-Sullivan et al. |
| 2009/0181478 A1 | 7/2009 | Cox et al. |
| 2009/0196160 A1 | 8/2009 | Crombach et al. |
| 2009/0201577 A1 | 8/2009 | Laplante et al. |
| 2009/0206320 A1 | 8/2009 | Chua et al. |
| 2009/0208753 A1 | 8/2009 | Coe-Sullivan et al. |
| 2009/0212695 A1 | 8/2009 | Kim et al. |
| 2009/0215208 A1 | 8/2009 | Coe-Sullivan et al. |
| 2009/0215209 A1 | 8/2009 | Anc et al. |
| 2009/0236621 A1 | 9/2009 | Chakraborty |
| 2009/0280586 A1 | 11/2009 | Coe-Sullivan |
| 2009/0283742 A1 | 11/2009 | Coe-Sullivan et al. |
| 2009/0286338 A1 | 11/2009 | Coe-Sullivan et al. |
| 2009/0296368 A1* | 12/2009 | Ramer ............................ 362/84 |
| 2009/0321755 A1 | 12/2009 | Jang et al. |
| 2010/0002414 A1 | 1/2010 | Meir et al. |
| 2010/0014799 A1 | 1/2010 | Bulovic et al. |
| 2010/0025595 A1 | 2/2010 | Bawendi et al. |
| 2010/0044635 A1 | 2/2010 | Breen et al. |
| 2010/0044636 A1 | 2/2010 | Ramprased et al. |
| 2010/0051870 A1 | 3/2010 | Ramprasad |
| 2010/0051898 A1 | 3/2010 | Kim et al. |
| 2010/0052512 A1 | 3/2010 | Clough et al. |
| 2010/0067214 A1 | 3/2010 | Coe-Sullivan et al. |
| 2010/0068468 A1 | 3/2010 | Coe-Sullivan et al. |
| 2010/0090597 A1 | 4/2010 | Werners et al. |
| 2010/0103648 A1 | 4/2010 | Kim et al. |
| 2010/0110728 A1* | 5/2010 | Dubrow et al. ............ 362/615 |
| 2010/0113813 A1 | 5/2010 | Pickett et al. |
| 2010/0123155 A1 | 5/2010 | Pickett et al. |
| 2010/0142182 A1 | 6/2010 | Van Woudenberg et al. |

(56) References Cited

U.S. PATENT DOCUMENTS

| | | |
|---|---|---|
| 2010/0142183 A1 | 6/2010 | Lerenius |
| 2010/0144231 A1 | 6/2010 | Landry et al. |
| 2010/0149814 A1 | 6/2010 | Zhai et al. |
| 2010/0155749 A1 | 6/2010 | Chen et al. |
| 2010/0165660 A1* | 7/2010 | Weber et al. ............... 362/609 |
| 2010/0167011 A1 | 7/2010 | Dubrow |
| 2010/0171136 A1 | 7/2010 | Sakai et al. |
| 2010/0193806 A1 | 8/2010 | Byun |
| 2010/0208493 A1 | 8/2010 | Choi et al. |
| 2010/0243053 A1 | 9/2010 | Coe-Sullivan et al. |
| 2010/0246009 A1 | 9/2010 | Polley et al. |
| 2010/0265307 A1 | 10/2010 | Linton et al. |
| 2010/0265734 A1 | 10/2010 | Bulovic et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0301360 A1 | 12/2010 | Van De Ven et al. |
| 2011/0025224 A1 | 2/2011 | Wood et al. |
| 2011/0081538 A1 | 4/2011 | Linton |
| 2011/0103064 A1 | 5/2011 | Coe-Sullivan et al. |
| 2011/0175510 A1 | 7/2011 | Rains, Jr. et al. |
| 2011/0186811 A1 | 8/2011 | Coe-Sullivan et al. |
| 2011/0199555 A1 | 8/2011 | Coe-Sullivan et al. |
| 2011/0233483 A1 | 9/2011 | Breen et al. |
| 2011/0299001 A1 | 12/2011 | Banin et al. |
| 2011/0309325 A1 | 12/2011 | Park et al. |
| 2012/0026721 A1* | 2/2012 | Kurt ............... F21S 48/115 362/84 |
| 2012/0056289 A1 | 3/2012 | Tian et al. |
| 2012/0113671 A1 | 5/2012 | Sadasivan et al. |
| 2012/0113672 A1* | 5/2012 | Dubrow et al. ............... 362/602 |
| 2012/0187367 A1 | 7/2012 | Modi et al. |
| 2012/0189791 A1 | 7/2012 | Modi et al. |
| 2012/0212931 A1* | 8/2012 | Kinoshita et al. ............... 362/84 |
| 2012/0256141 A1 | 10/2012 | Nick et al. |
| 2013/0114301 A1 | 5/2013 | Um |
| 2013/0148376 A1 | 6/2013 | Nick et al. |
| 2013/0164875 A1 | 6/2013 | Lamansky et al. |
| 2013/0170178 A1* | 7/2013 | Yoo ............... G02B 6/4298 362/84 |
| 2013/0271700 A1 | 10/2013 | Nakamura et al. |
| 2013/0271961 A1 | 10/2013 | Nakamura |
| 2014/0068356 A1 | 3/2014 | Chiang et al. |
| 2014/0158982 A1 | 6/2014 | Park et al. |
| 2014/0240644 A1 | 8/2014 | Abe |
| 2015/0214445 A1 | 7/2015 | Qiu et al. |
| 2015/0338064 A1 | 11/2015 | Ishino |

FOREIGN PATENT DOCUMENTS

| | | | |
|---|---|---|---|
| EP | 0328202 A2 | 8/1989 | |
| EP | 173158 | 12/2006 | |
| JP | 12607073 | 10/1989 | |
| JP | 02244104 | 9/1990 | |
| JP | 04229807 | 8/1992 | |
| JP | 4238304 | 8/1992 | |
| JP | 04281433 | 10/1992 | |
| JP | 05152609 B2 | 6/1993 | |
| JP | 05303017 | 11/1993 | |
| JP | 06238161 | 8/1994 | |
| JP | 06301071 | 10/1994 | |
| JP | 07002912 | 1/1995 | |
| JP | 07176794 | 7/1995 | |
| JP | 08007614 | 1/1996 | |
| JP | 09027642 | 1/1997 | |
| JP | 09050057 | 2/1997 | |
| JP | 10012925 | 1/1998 | |
| JP | 2002216962 | 8/2002 | |
| JP | 2004071357 A | 3/2004 | |
| JP | 2004107572 A | 4/2004 | |
| JP | 200673202 A | 3/2006 | |
| JP | 2006073869 | 3/2006 | |
| JP | 2007103513 A | 4/2007 | |
| JP | 2016167451 A | 9/2016 | |
| KR | 20110012246 A | 2/2011 | |
| WO | 2003070816 | 8/2003 | |
| WO | 2003079414 A2 | 9/2003 | |
| WO | 2006022123 A1 | 3/2006 | |
| WO | 2006104689 | 10/2006 | |
| WO | 2006120895 A1 | 11/2006 | |
| WO | 2007002234 | 1/2007 | |
| WO | 2007009010 | 1/2007 | |
| WO | 2007051499 A1 | 5/2007 | |
| WO | 2007136816 | 11/2007 | |
| WO | 2008029633 | 8/2008 | |
| WO | 2009002512 | 12/2008 | |
| WO | WO2009002512 A1 | 12/2008 | |
| WO | 2009011922 | 1/2009 | |
| WO | 2009014590 | 1/2009 | |
| WO | 2009014707 | 1/2009 | |
| WO | WO2009035657 A1 | 3/2009 | |
| WO | 2009137053 | 11/2009 | |
| WO | WO2009137053 A1 | 11/2009 | |
| WO | 2009145813 A1 | 12/2009 | |
| WO | 2009151515 A1 | 12/2009 | |
| WO | WO2009145813 A1 | 12/2009 | |
| WO | WO2009151515 A1 | 12/2009 | |
| WO | 2010014205 | 2/2010 | |
| WO | WO2010129350 A2 | 11/2010 | |
| WO | WO2010129374 A2 | 11/2010 | |
| WO | 2011020098 A1 | 2/2011 | |
| WO | WO2011031871 A1 | 3/2011 | |
| WO | WO2012021643 A2 | 2/2012 | |
| WO | WO2012135744 A2 | 10/2012 | |
| WO | WO2013042470 A1 | 3/2013 | |

OTHER PUBLICATIONS

Murray, C.B., et al., "Synthesis and Characterization of Monodisperse Nanocrystals and Close-Packed Nanocrystal Assemblies", *Annu. Rev. Mater. Sci.*, (2000), 30: pp. 545-610.

Murray, C., et al., "Synthesis and Characterization of Nearly Monodisperse CdE (E=S, Se, Te) Semiconductor Nanocrystallites", *J. Am. Chem. Soc.*, (1993) 115, pp. 8706-8715.

Chinese Office Action for Chinese Patent Application No. 201180068182.0 dated Jan. 20, 2017.

Japanese Office Action for Japanese Patent Application No. 2016-041098 dated May 30, 2016.

Japanese Patent Application No. 2016041098 dated Mar. 29, 2017, with English Translation.

JP Office Action dated May 19, 2017; JP Application No. 2016-041098 (7 pages—English translation).

Korean Notice of Allowance dated Mar. 29, 2017 of the corresponding Korean Patent Application No. 10-2010-7001056 with English Translation.

* cited by examiner

LIGHTING DEVICE INCLUDING QUANTUM DOTS

CLAIM OF PRIORITY

This application claims priority to U.S. Provisional Patent Application No. 61/655,789, filed on 5 Jun. 2012, which is hereby incorporated herein by reference in its entirety for all purposes.

TECHNICAL FIELD OF THE INVENTION

The present invention relates to the technical field of quantum dots and devices and products including quantum dots.

SUMMARY OF THE INVENTION

The present invention relates to a lighting device including quantum dots and products including same.

In accordance with one aspect of the present invention, there is provided a lighting device comprising: a sealed container at least a portion of which is light transmissive, at least one emissive material comprising quantum dots dispersed in a medium, the at least one emissive material being disposed within the sealed container, and a light guiding member, at least a portion of which is included in the sealed container, wherein the light guiding member extends from an internal surface of the container into the interior of the container, wherein the lighting device is adapted for optically coupling the light guiding member to a light source.

A lighting device described herein including an at least partially integrated light guiding member can improve the uniformity of the distribution of light from the light source to the emissive material disposed within the sealed container. Such improved uniformity in distributing exciting light to the quantum dots included in the sealed container can improve the homogeneity of light emitted from the lighting device. This can be particularly beneficial for optically exciting emissive materials including quantum dots and a medium disposed within sealed containers having an elongated configuration. This can also be beneficial for exciting emissive materials including quantum dots and a medium disposed within sealed containers having various or arbitrary shapes in which even distribution from a light source is difficult.

Preferably the medium comprises a liquid.

In certain embodiments, for example, a light guiding member can extend from an internal surface of a side wall of the container into the interior of the container. In certain embodiments, for example, a light guiding member can extend from an internal surface of an end wall of the container into the container.

Various techniques can be utilized for adapting the lighting device for optically coupling the light guiding member to a light source. For example, the lighting device can be adapted such that light from the light source is externally optically coupled to the light guiding member. Other techniques can also be used.

In certain embodiments, the at least a portion of the light guiding member is substantially perpendicular to the internal surface of the sealed container from which it extends.

The at least a portion of the light guiding member can extend along the center longitudinal axis of the sealed container. Alternatively, the at least a portion of the light guiding member can extend along the center lateral axis of the sealed container.

In certain embodiments, light can be optically coupled to the light guiding member in a direction orthogonal to the orientation of the light guiding member in the lighting device.

In certain embodiments, light can be optically coupled into an end of the light guiding member.

In certain embodiments, the at least a portion of the light guiding member extends along a longitudinal dimension of the sealed container parallel to a side wall of the sealed container.

In certain embodiments, the at least a portion of the light guiding member is in contact with an external edge of the sealed container.

In certain embodiments, the internal surface of the sealed container from which the at least a portion of the light guiding member extends is the internal surface of an end surface (e.g., end wall or end section) of the sealed container.

In certain embodiments, the internal surface of the sealed container from which the at least a portion of the light guiding member extends is the internal surface of an end surface (e.g., end wall or end section) of the sealed container and the light guiding member extends to an internal surface of the opposite end of the sealed container.

In certain embodiments, the internal surface of the sealed container from which the at least a portion of the light guiding member extends is the internal surface of an end surface of the sealed container and a second portion of the light guiding member extends through the end surface to the exterior of the sealed container.

A lighting device in accordance with the present invention can further include one or more light sources optically coupled to the light guiding member.

Examples of light sources include semiconductor light emitting devices, including, e.g., but not limited to, inorganic semiconductor light emitting devices. Other types of solid state light sources and other types of light sources may also be used. Light sources are selected to emit light with a preselected emission wavelength. In certain embodiments, a light source that emits light in the visible spectrum can be used. In certain embodiments, for example, a light source that emits light in the blue region of the spectrum or the violet region (e.g., including, but not limited to, 405 nm) of the spectrum can be desirable. In certain embodiments, a light source that emits ultraviolet light (e.g., including but not limited to 375-395 nm) can be used. When a plurality of light sources are included, each light source can emit light with preselected emission wavelength that is the same as, or different from, that emitted by any one or more of the other light sources.

A lighting device in accordance with the present invention can optionally further include a reflector positioned to reflect emitted light from the light source to the light guiding member and/or back into the light guiding member.

In an embodiments of a lighting device in accordance with the present invention in which light is coupled into an end of the light emitting member, the lighting device can optionally further include a reflector positioned at the end of the light guiding member opposite the light source to recycle light back into the light guiding member.

In certain embodiments of a lighting device of the present invention, the light guiding member can extend from the internal surface of one end surface of the sealed container to an second internal surface at the opposite end of the sealed container and also extends from a first internal side surface of the sealed container to a second internal side surface of the sealed container thereby forming two chambers in the sealed container. In certain of such embodiments, two symmetrical chambers are formed in the lighting device, the two chambers being separated by the light guiding member extending between the ends of the sealed container.

In certain embodiments including two chambers, each of the chambers can include at least one emissive material comprising quantum dots dispersed in a medium. Each emissive material can have emissive characteristics that are the same as, or different from, any one or more of the emissive material included in any other chamber.

In certain embodiments, the light source comprises a light strip including plurality of light emitting devices, the strip being optically coupled to the light guiding member along one of the side surfaces of the sealed container to which the light guiding member extends. This can permit the light emitting device to be further spaced from the emissive material.

In accordance with embodiments of the present invention, an emissive material comprising quantum dots in a medium can be capable of converting at least a portion of light emitted by a light source to light having a maximum peak emission different from that of the light emitted by the light source. In certain embodiments, it may be desirable for the emissive material(s) included in the lighting device to convert all or substantially all of the light emitted by the light source to one or more different colors to obtain a desired light output. In certain embodiments, it may be desirable for the emissive material(s) included in the lighting device to convert only a portion of the light emitted by the light source to one or more different colors. In such case the light output of the lighting device includes a mixture of converted light and unconverted light to obtain a desired light output.

In certain embodiments, a lighting device can include one or more emissive materials each of which can include one or more different types of quantum dots wherein each type of quantum dot can have light emission characteristics that may be different from those of another other type of quantum dot included in an emissive material. In certain embodiments, for example, a lighting device can include more than one emissive material, each of which can have light emission characteristics different from those of at least one other emissive material. In certain embodiments, each emissive material can include one or more different types of quantum dots being capable of converting a portion of light emitted by a light source to light having a maximum peak emission that is the same as, or different from, that emitted by at least one other type of quantum dot included in the emissive material.

In certain embodiments, light output of a lighting device can be further modified by inclusion of optional filters or color changing/enhancing components.

In certain embodiments, the light guiding member can be configured as a central core with a preselected number of vanes that radiate from the central core along the length thereof, such that when such light guiding member is positioned and secured within the sealed container, it can divide the internal chamber of the sealed contained into a plurality of chambers (or channels) that run the length of the sealed container. Each of the chambers can include at least one emissive material comprising quantum dots dispersed in a medium. Each emissive material can have emissive characteristics that are the same as, or different from, any one or more of the emissive material included in any other chamber.

In certain preferred embodiments, the light guiding member has a refractive index greater than the refractive index of the medium.

Preferably, the lighting device includes a sealed container that is hermetically sealed. Such hermetic seal is more preferably substantially impervious to water and oxygen.

In embodiments, it can be preferred for a major portion, or the entire, sealed container to be light transmissive.

In accordance with another aspect of the present invention, there is provided a lighting device comprising: a sealed container at least a portion of which is light transmissive, the sealed container including at least two separate chambers, at least one chamber including a first emissive material comprising quantum dots dispersed in a medium, wherein the chamber including the first emissive material is separated from a second chamber including a second emissive material by an optically transmissive element, wherein the lighting device is adapted for optically coupling the sealed container to a light source.

Preferably the medium comprises a liquid medium.

In certain embodiments, the optically transmissive element has a refractive index greater than that of the emissive material included in the chamber positioned between the light source and the optically transmissive element. This can permit light to be waveguided or coupled into the waveguide from the emissive material in the chamber positioned between the light source and the optically transmissive element.

In certain embodiments, the optically transmissive element has a refractive index approximately equal to that that of the emissive included in the chamber positioned between the light source and the optically transmissive element. This can permit transmission of light into the optically transmissive element from the emissive material in the chamber positioned between the light source and the optically transmissive element.

In certain embodiments, the optically transmissive element has a refractive index less than that of the emissive material included in the chamber positioned between the light source and the optically transmissive element. This can permit transmission of light into the optically transmissive element from the emissive material in the chamber positioned between the light source and the optically transmissive element.

In certain embodiments, light is optically coupled into the sealed container in a direction orthogonal to the longitudinal axis of the optically transmissive element.

In certain embodiments, light is optically coupled into the sealed container into an end of the optically transmissive element.

In certain embodiments, a lighting device can further including a reflector positioned to reflect emitted light from the light source to the sealed container.

In certain embodiments, a lighting device can include one or more emissive materials capable of converting a portion of light emitted by the light source to light having a maximum peak emission different from that of the light emitted by the light source.

Preferably, the lighting device includes a sealed container that is hermetically sealed. Such hermetic seal is more preferably substantially impervious to water and oxygen.

In embodiments, it can be preferred for a major portion, or the entire, sealed container to be light transmissive.

In accordance with another aspect of the present invention, there is provided a backlight unit including a lighting device taught herein.

In accordance with another aspect of the present invention, there is provided a liquid crystal display including a lighting device taught herein.

In accordance with another aspect of the present invention, there is provided a liquid crystal display including a backlight unit including a lighting device taught herein.

In accordance with another aspect of the present invention there is provided a lighting system including a lighting device described herein optically coupled to one or more light sources and a reflector having a reflecting surface configured and positioned to reflect light emission from the one or more light sources into the lighting device and to reflect light emission from the lighting device in a forward direction from the lighting system.

Each of the claims set forth at the end of the present application are hereby incorporated into this Summary section by reference in its entirety.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 2:
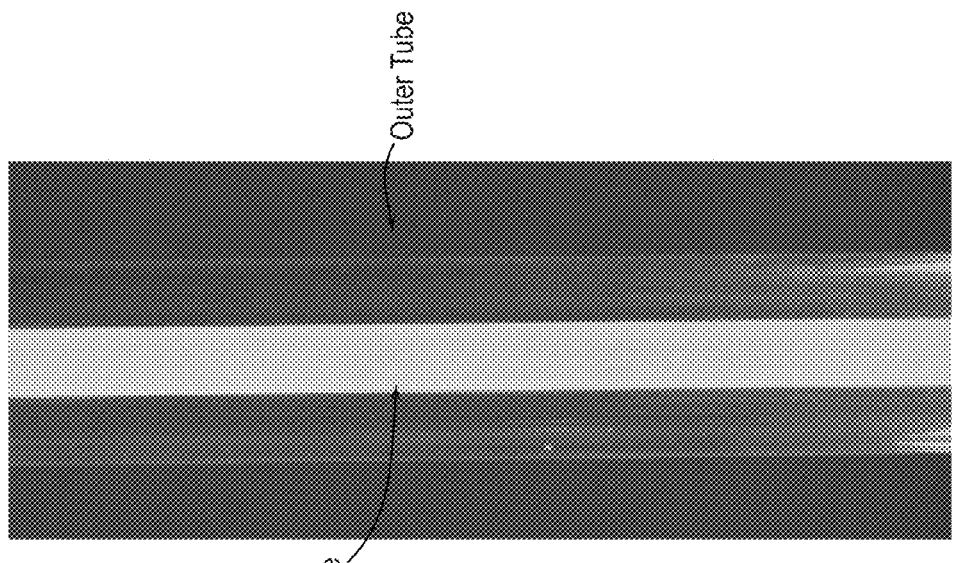
FIG. 2 is a photograph of a portion of an embodiment of the present invention including a tubular container (e.g., an "outer tube") including a cylindrical light emitting member (e.g., "waveguide") disposed within.

The attached figures are simplified representations presented for purposes of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

In accordance with one aspect of the present invention, there is provided a lighting device comprising: a sealed container at least a portion of which is light transmissive, at least one emissive material comprising quantum dots dispersed in a medium, the at least one emissive material being disposed within the sealed container, and a light guiding member, at least a portion of which is included in the sealed container, wherein the light guiding member extends from an internal surface of the container into the container, wherein the lighting device is adapted for optically coupling the light guiding member to a light source.

In certain embodiments, for example, a light guiding member can extend from an internal surface of a side wall of the container into the container. In certain embodiments, for example, a light guiding member can extend from an internal surface of an end wall of the container into the container.

Various techniques can be utilized for adapting the lighting device for optically coupling the light guiding member to a light source. For example, the lighting device can be adapted such that light from the light source is externally optically coupled to the light guiding member. Other techniques can also be used.

In certain embodiments, the at least a portion of the light guiding member is substantially perpendicular to the internal surface of the sealed container from which it extends.

The at least a portion of the light guiding member can extend along the center longitudinal axis of the sealed container. Alternatively, the at least a portion of the light guiding member can extend along the center lateral axis of the sealed container.

In certain embodiments, light can be optically coupled to the light guiding member in a direction orthogonal to the orientation of the light guiding member.

In certain embodiments, light can be optically coupled into the end of the light guiding member.

In certain embodiments, the at least a portion of the light guiding member extends along a longitudinal dimension of the sealed container parallel to a side wall of the sealed container.

In certain embodiments, the at least a portion of the light guiding member is in contact with an external edge of the sealed container.

In certain embodiments, the internal surface of the sealed container from which the at least a portion of the light guiding member extends is the internal surface of an end surface (e.g., end wall or end section) of the sealed container.

In certain embodiments, the internal surface of the sealed container from which the at least a portion of the light guiding member extends is the internal surface of an end surface (e.g., end wall or end section) of the sealed container and the light guiding member extends to an internal surface of the opposite end of the sealed container.

In certain embodiments, the internal surface of the sealed container from which the at least a portion of the light guiding member extends is the internal surface of an end surface of the sealed container and a second portion of the light guiding member extends through the end surface to the exterior of the sealed container.

A lighting device in accordance with the present invention can further include one or more light sources optically coupled to the light guiding member.

Examples of light sources include semiconductor light emitting devices, including, e.g., but not limited to, inorganic semiconductor light emitting devices. Light sources are selected to emit light with a preselected emission wavelength. When a plurality of light sources are included, each light source can emit light with preselected emission wavelength that is the same as, or different from, that emitted by any one or more of the other light sources.

A lighting device in accordance with the present invention can optionally further include a reflector positioned to reflect emitted light from the light source to the light guiding member or back into the light guiding member.

In an embodiments of a lighting device in accordance with the present invention in which light is coupled into an end of the light emitting member, the lighting device can optionally further include a reflector positioned at the end of the light guiding member opposite the light source to recycle light back into the light guiding member.

In certain embodiments of a lighting device of the present invention, the light guiding member can extend from the internal surface of one end surface of the sealed container to an second internal surface at the opposite end of the sealed container and also extends from a first internal side surface of the sealed container to a second internal side surface of the sealed container thereby forming two chambers in the sealed container. In certain of such embodiments, two symmetrical chambers are formed in the lighting device, the two chambers being separated by the light guiding member extending between the ends and the sides of the sealed container.

In certain embodiments including two chambers, each of the chambers can include at least one emissive material comprising quantum dots dispersed in a medium. Each emissive material can have emissive characteristics that are the same as, or different from, any one or more of the emissive material included in any other chamber.

In certain embodiments, the light source comprises a light strip including plurality of light emitting devices, the strip being optically coupled to the light guiding member along one of the side surfaces of the sealed container to which the light guiding member extends. This can permit the light emitting device to be further spaced from the emissive material.

In accordance with embodiments of the present invention, an emissive material comprising quantum dots in a medium can be capable of converting at least a portion of light emitted by a light source to light having a maximum peak emission different from that of the light emitted by the light source. In certain embodiments, it may be desirable to convert all or substantially all of the light emitted by the light source to one or more different colors to obtain a desired light output. In certain embodiments, it may be desirable to convert only a portion of the light emitted by the light source to one or more different colors. In such case the light output of the lighting device includes a mixture of converted light and unconverted light to obtain a desired light output.

In certain embodiments, a lighting device can include one or more emissive materials each of which can include one or more different types of quantum dots wherein each can have light emission characteristics that may be the different from those of another other type of quantum dot included in an emissive material. In certain embodiments, for example, a lighting device can include more than one emissive material each of which can have light emission characteristics different from at least one other emissive material. In certain embodiments, each emissive material can include one or more different types of quantum dots being capable of converting a portion of light emitted by a light source to light having a maximum peak emission that is the same as, or different from, that emitted by at least one other type of quantum dot included in the emissive material.

In certain embodiments, light output of a lighting device can be further modified by inclusion of optional filters or color changing/enhancing components.

In certain embodiments, the light guiding member can be configured as a central core with a preselected number of vanes that radiate from the central core for the length thereof, such that when such light guiding member is positioned and secured within the sealed container, it divide the internal chamber of the sealed contained into a plurality of chambers (or channels) that run the length of the sealed container. Each of the chambers can include at least one emissive material comprising quantum dots dispersed in a medium. Each emissive material can have emissive characteristics that are the same as, or different from, any one or more of the emissive material included in any other chamber.

In certain preferred embodiments, the light guiding member has a refractive index greater than the refractive index of the medium.

Preferably, the lighting device includes a sealed container that is hermetically sealed. Such hermetic seal is more preferably substantially impervious to water and oxygen.

In embodiments, it can be preferred for a major portion, or the entire, sealed container to be light transmissive.

In accordance with another aspect of the present invention, there is provided a lighting device comprising: a sealed container at least a portion of which is light transmissive, the sealed container including at least two separate chambers, at least one chamber including a first emissive material comprising quantum dots dispersed in a medium, wherein the chamber including the first emissive material is separated from a second chamber including a second emissive material by an optically transmissive element, wherein the lighting device is adapted for optically coupling the sealed container to a light source.

In certain embodiments, the optically transmissive element has a refractive index greater than that of the emissive material included in the chamber positioned between the light source and the optically transmissive element. This can permit light to be waveguided or coupled into the waveguide from the emissive material in the chamber positioned between the light source and the optically transmissive element.

In certain embodiments, the optically transmissive element has a refractive index approximately equal to that that of the emissive included in the chamber positioned between the light source and the optically transmissive element. This can permit transmission of light into the optically transmissive element from the emissive material in the chamber positioned between the light source and the optically transmissive element.

In certain embodiments, the optically transmissive element has a refractive index less than that of the emissive material included in the chamber positioned between the light source and the optically transmissive element. This can permit transmission of light into the optically transmissive element from the emissive material in the chamber positioned between the light source and the optically transmissive element.

In certain embodiments, light is optically coupled into the sealed container in a direction orthogonal to the longitudinal axis of the optically transmissive element.

In certain embodiments, light is optically coupled into an end of the optically transmissive element.

In certain embodiments, a lighting device can further including a reflector positioned to reflect emitted light from the light source to the sealed container.

In certain embodiments, a lighting device can include one or more emissive materials capable of converting a portion of light emitted by the light source to light having a maximum peak emission different from that of the light emitted by the light source.

Preferably, the lighting device includes a sealed container that is hermetically sealed. Such hermetic seal is more preferably substantially impervious to water and oxygen.

In embodiments, it can be preferred for a major portion, or the entire, sealed container to be light transmissive.

In accordance with another aspect of the present invention, there is provided a backlight unit including a lighting device taught herein.

In accordance with another aspect of the present invention, there is provided a liquid crystal display including a lighting device taught herein.

In accordance with another aspect of the present invention, there is provided a liquid crystal display including a backlight unit including a lighting device taught herein.

In accordance with another aspect of the present invention there is provided a lighting system including a lighting device described herein optically coupled to one or more light sources and a reflector having a reflecting surface configured and positioned to reflect light emission from the one or more light sources into the lighting device and to reflect light emission from the lighting device in a forward direction from the lighting system.

A sealed container according to the present invention can comprise various configurations, such as length, width, wall thickness, and cross-sectional configuration. In certain embodiments, a container can comprise a tubular shaped container or tube. The term "tube" as used in the present disclosure includes a capillary, and the term "tube" and "capillary" may be used interchangeably. At least a portion of a container is light transmissive portion. Preferably a major portion or all of the sealed contained is light transmissive. Light transmissive portions of the sealed container can permit light to pass through the light transmissive portion thereof. Preferably the container is fabricated from material(s) selected to avoid, resist or inhibit cracking during use. In certain embodiments, a sealed container fabricated from glass can be preferred. Such containers can have configurations known to those of skill in the art.

In certain embodiments, a container can comprise a body member with end pieces that can be attached to the body to form a sealed container.

A container preferably has a hollow interior.

According to one aspect, a container of the present disclose is made from a transparent material and has a hollow interior.

One or more emissive materials comprising quantum dots dispersed in a medium are included in the sealed container.

An emissive material can include a mixture or combination or ratio of quantum dots that are used to achieve certain desired radiation output. Such quantum dots can emit red and green light of certain wavelength when exposed to a suitable stimulus. Still further embodiments are directed to various formulations including quantum dots which are used in various light emitting applications. Emissive materials including quantum dots in a medium may also be referred to herein as "quantum dot formulations" or "optical materials".

Emissive materials including quantum dots and a medium can optionally further include additional components, e.g., but not limited to, a scattering agent, a rheology modifier, a filler, UV absorber, a dispersant, leveling agent, colorants (e.g., dyes), phosphor particles, humectants, extenders, etc. and mixtures including one or more of the foregoing. Preferably a medium is used that avoids yellowing with use and/or with aging. Yellowing can lead to a lowering of optical performance by absorbing light emitted by the quantum dots and light emitted by the LED which can lead to a shift in the color point.

Embodiments of the present invention are still further directed to various backlight unit designs including the quantum dot-containing tubes, LEDs, and light guides for the efficient transfer of the generated light to and through the light guide for use in liquid crystal displays. According to certain aspects, methods and devices are provided for the illumination and stimulation of quantum dots within tubes and the efficient coupling or directing of resultant radiation to and through a light guide.

An emissive material is preferably introduced into the container under oxygen-free conditions and the container is then sealed under oxygen free conditions.

A container within the scope of the present invention can have a tubular shape. The dimensions of the container are selected based upon the intended end-use application for the lighting device.

In certain embodiments, a round or oval cross-section can be preferred. In certain embodiments, a race-track shaped cross-section can be desirable. However, other geometries (e.g., rectangular, square, etc.) can also be useful based upon the intended end-use application for the lighting device.

According to one aspect, the walls of the container are straight or flat and provide a consistent or uniform path length through the tube and accordingly through the emissive therein through which photons from an LED may pass. Substantially parallel and straight walls also advantageously provide a flat face to couple the container (e.g., tube) to a corresponding flat end of a light guide plate of a back light unit.

In certain embodiments, sealing of the container can comprise using glass to seal one or both ends of the container.

In certain embodiments, the container is hermetically sealed, i.e., impervious to gases and moisture, thereby providing a sealed capillary where oxygen is substantially or completely absent within the sealed container.

In certain embodiments, the container is pseudo-hermetically sealed, i.e., at least partially impervious to gases and moisture.

Other suitable techniques can be used for sealing the container.

A light guiding member is preferably transparent to light coupled to the light guiding member from a light source. In certain embodiments, it is desirable for the light guiding member to also be transparent to light emitted by an emissive material.

In certain embodiments and aspects of the inventions contemplated by this disclosure including a light guiding component can comprise a rigid material, e.g., glass, polycarbonate, acrylic, quartz, sapphire, or other known rigid materials with waveguiding characteristics.

In certain embodiments and aspects of the inventions contemplated by this disclosure, a light guiding member can alternatively comprise a flexible material, e.g., a polymeric material such as plastic or silicone (e.g. but not limited to thin acrylic, epoxy, polycarbonate, PEN, PET, PE).

In certain embodiments and aspects of the inventions contemplated by this disclosure, a light guiding member (which may also be referred to herein as a waveguide or waveguide component) may have an outer surface, at least a portion of which has a texture selected to enhance or otherwise alter the pattern, angle, or other feature of light transmitted therethrough. For example, in certain embodiments, the surface may be smooth; in certain embodiments, the surface may be non-smooth (e.g., the surface is roughened or the surface includes one or more raised and/or depressed features); in certain embodiments, the surface may include both smooth and non-smooth regions.

In certain embodiments, a lighting device described herein can include a light guiding member wherein the optical properties thereof vary along the length thereof.

In certain embodiments scatterers may be included at the interface between the light guiding member and the emissive material.

In certain embodiments and aspects of the inventions contemplated by this disclosure, the geometrical shape and dimensions of a light guiding member can be selected based on the particular end-use application. In certain embodiments, the thickness of the light guiding member can be substantially uniform. In certain embodiments, the thickness of the waveguide can be non-uniform (e.g., tapered).

In certain embodiments, a light guiding member preferably has a solid (as opposed to hollow) cross section.

As mentioned above, in certain embodiments, an emissive material can further optionally include light scatterers or scattering agents. Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles). Preferably the scatterers are not luminescent.

Selection of the size and size distribution of the scatterers is readily determinable by those of ordinary skill in the art. The size and size distribution can be based upon the refractive index mismatch of the scattering particle and the host material in which the light scatterers are to be dispersed, and the preselected wavelength(s) to be scattered according to Rayleigh scattering theory. The surface of the scattering particle may further be treated to improve dispersability and stability in the host material. In one non-limiting example, the scattering particles can comprises $TiO_2$ (R902+ from DuPont) of 0.2 μm particle size.

The inclusion of scatterers in an emissive material is useful in applications where the emissive material is contained in a clear vessel having edges to limit losses due the total internal reflection. The amount of the scatterers may be altered relative to the amount of quantum dots used in the formulation. For example, when the amount of the scatter is increased, the amount of quantum dots may be decreased.

As mentioned above, in certain embodiments, an emissive material can further optionally include one or more rheology modifiers (or thixotropes). Examples of rheology modifiers (thixotropes) include fumed silica commercially available from Cabot Corporation such as TS-720 treated fumed silica, treated silica commercially available from Cabot Corporation such as TS720, TS500, TS530, TS610 and hydrophilic silica such as M5 and EHS commercially available from Cabot Corporation. The amount of light scattering agents included in an emissive material can be readily determined by the skilled artisan.

As also mentioned above, in certain embodiments, an emissive material can further optionally include a filler. Examples of fillers include silica, fumed silica, precipitated silica, glass beads, PMMA beads and the like. The amount of light scattering agents included in an emissive material can be readily determined by the skilled artisan.

According to additional aspects, quantum dots are nanometer sized particles that can have optical properties arising from quantum confinement. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety.

Quantum dots can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

Preferably, a quantum dot comprises a semiconductor nanocrystal. In certain embodiments, a semiconductor nanocrystal has an average particle size in a range from about 1 to about 20 nm, and preferably from about 1 to about 10 nm. However, depending upon the composition, structure, and desired emission wavelength of the quantum dot, the average diameter may be outside of these ranges.

A quantum dot can comprise one or more semiconductor materials.

Examples of semiconductor materials that can be included in a quantum dot (including, e.g., semiconductor nanocrystal) include, but are not limited to, a Group IV element, a Group II-VI compound, a Group II-V compound, a Group compound, a Group III-V compound, a Group IV-VI compound, a Group compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain embodiments, quantum dots can comprise a core comprising one or more semiconductor materials and a shell comprising one or more semiconductor materials, wherein the shell is disposed over at least a portion, and preferably all, of the outer surface of the core.

A quantum dot including a core and shell is also referred to as a "core/shell" structure.

For example, a quantum dot can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe)CdZnS (core)shell, etc.), and blue (e.g., (CdS)CdZnS (core)shell.

Quantum dots can have various shapes, including, but not limited to, sphere, rod, disk, other shapes, and mixtures of various shaped particles.

In certain embodiments, quantum dots can be doped with activator ions.

Preferably the quantum dots are undoped.

One example of a method of manufacturing a quantum dot (including, for example, but not limited to, a semiconductor nanocrystal) is a colloidal growth process. Colloidal growth occurs by injection an M donor and an X donor into a hot coordinating solvent. One example of a preferred method for preparing monodisperse quantum dots comprises pyrolysis of organometallic reagents, such as dimethyl cadmium, injected into a hot, coordinating solvent. This permits discrete nucleation and results in the controlled growth of macroscopic quantities of quantum dots. The injection produces a nucleus that can be grown in a controlled manner to form a quantum dot. The reaction mixture can be gently heated to grow and anneal the quantum dot. Both the average size and the size distribution of the quantum dots in a sample are dependent on the growth temperature. The growth temperature for maintaining steady growth increases with increasing average crystal size. Resulting quantum dots are members of a population of quantum dots. As a result of the discrete nucleation and controlled growth, the population of quantum dots that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

An example of an overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained.

The narrow size distribution of the quantum dots (including, e.g., semiconductor nanocrystals) allows the possibility of light emission in narrow spectral widths. Monodisperse semiconductor nanocrystals have been described in detail in Murray et al. (J. Am. Chem. Soc., 115:8706 (1993), which is hereby incorporated herein by reference in its entirety.

The process of controlled growth and annealing of the quantum dots in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. For example, an M donor can comprise cadmium, zinc, magnesium, mercury, aluminum, gallium, indium or thallium, and the X donor can comprise a compound capable of reacting with the M donor to form a material with the general formula MX. The X donor can comprise a chalcogenide donor or a pnictide donor, such as a phosphine chalcogenide, a bis (silyl) chalcogenide, dioxygen, an ammonium salt, or a tris(silyl) pnictide. Suitable X donors include, for example, but are not limited to, dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl) telluride ($(TMS)_2Te$), bis(trimethylsilyl)sulfide ($(TMS)_2S$), a trialkyl phosphine sulfide such as (tri-noctylphosphine) sulfide (TOPS), an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris(trimethylsilyl) antimonide ($(TMS)_3Sb$). In certain embodiments, the M donor and the X donor can be moieties within the same molecule.

A coordinating solvent can help control the growth of the quantum dot. A coordinating solvent is a compound having a donor lone pair that, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri (dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

In certain embodiments, quantum dots can alternatively be prepared with use of non-coordinating solvent(s).

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

Semiconductor nanocrystals and other types of quantum dots preferably have ligands attached thereto. According to one aspect, quantum dots within the scope of the present invention include green CdSe quantum dots having oleic acid ligands and red CdSe quantum dots having oleic acid ligands. Alternatively, or in addition, octadecylphosphonic acid ("ODPA") ligands may be used instead of oleic acid ligands. The ligands promote solubility of the quantum dots in the polymerizable composition which allows higher loadings without agglomeration which can lead to red shifting.

Ligands can be derived from a coordinating solvent that may be included in the reaction mixture during the growth process.

Ligands can be added to the reaction mixture.

Ligands can be derived from a reagent or precursor included in the reaction mixture for synthesizing the quantum dots.

In certain embodiments, quantum dots can include more than one type of ligand attached to an outer surface.

A quantum dot surface that includes ligands derived from the growth process or otherwise can be modified by repeated exposure to an excess of a competing ligand group (including, e.g., but not limited to, coordinating group) to form an overlayer. For example, a dispersion of the capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

For example, a quantum dot can be exposed to short chain polymers which exhibit an affinity for the surface and which terminate in a moiety having an affinity for a suspension or dispersion medium. Such affinity improves the stability of the suspension and discourages flocculation of the quantum dot. Examples of additional ligands include fatty acid ligands, long chain fatty acid ligands, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques, for example, as described in J. March, Advanced Organic Chemistry, which is incorporated herein by reference in its entirety.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

In certain embodiments, an emissive material includes quantum dots that emit light at a predetermined wavelength. For example, and without limitation, an emissive material can include quantum dots that emit wavelengths characteristic of red light. In certain embodiments, quantum dots capable of emitting red light emit light having a peak center wavelength in a range from about 615 nm to about 635 nm, and any wavelength or range in between whether overlapping or not. For example, the quantum dots can be capable or emitting red light having a peak center wavelength of about 635 nm, about 630 nm, of about 625 nm, of about 620 nm, of about 615 nm. In another non-limiting example, an emissive material can include quantum dots that emit wavelength characteristic of green light. In certain embodiments, quantum dots capable of emitting green light emit light having a peak center wavelength in a range from about 520 nm to about 545 nm, and any wavelength or range in between whether overlapping or not. For example, the quantum dots can be capable or emitting green light having a peak center wavelength of about 520 nm, of about 525 nm, of about 535 nm, of about 540 nm or of about 540 nm.

In certain embodiments, an emissive material can include a mixture of two or more different types of quantum dots that emit light having a peak center wavelength at different wavelengths.

According to further aspects of the present invention, the quantum dots exhibit a narrow emission profile in the range of, for example, between about 20 nm and about 60 nm at full width half maximum (FWHM). The narrow emission profile of quantum dots of the present invention allows the tuning of the quantum dots and mixtures of quantum dots to emit saturated colors thereby increasing color gamut and power efficiency beyond that of conventional LED lighting displays.

A medium included in an emissive material preferably comprises a liquid. Preferably a liquid medium comprises a liquid that does not chemically alter the quantum dot particle. In certain preferred embodiments, the liquid medium comprises a liquid in which the quantum dots can be colloidally stable. Examples of suitable liquids for use as a liquid medium include, without limitation, octadecene, mineral oil, gels, silicones, tri-n-octyl phosphine oxide (TOPO), and other coordinating solvents useful for preparing quantum dots and/or as ligands. Additional liquids may be determined by the skilled artisan to be useful or desirable as a liquid medium for inclusion in an emissive material In certain embodiments, a medium can include a mixture including two or more liquids.

An emissive material may include quantum dots in an amount up to the colloidal stability limit of the quantum dots in the liquid medium under the use/operating conditions of the lighting device in the intended end-use application.

Quantum dots in accordance with the present invention can be included in an emissive material in various amounts of one or more type of quantum dots and one or more liquid media. Such emissive materials can further include one or more scatterers. Other optional additives or ingredients can also be included in an emissive material. One of skill in the art will readily recognize from the present invention that additional ingredients can be included depending upon the particular intended application for the quantum dots.

In certain embodiments, quantum dots included in an emissive material can be encapsulated. Nonlimiting examples of encapsulation materials, related methods, and other information that may be useful are described in International Application No. PCT/US2009/01372 of Linton, filed 4 Mar. 2009 entitled "Particles Including Nanoparticles, Uses Thereof, And Methods" and International Application No. PCT/US2010/048285 of Nick et al., filed 9 Sep. 2010, entitled "Particles Including Nanoparticles, Uses Thereof, And Methods", each of the foregoing being hereby incorporated herein by reference in its entirety.

In certain embodiments, a sealed container can further optionally include anti-reflection, light polarizing, and/or other coatings on an outer surface. Other outcoupling features can further be optionally included.

The present invention will be further clarified by the examples shown in the figures, which are intended to be exemplary of the present invention.

Figure 1:
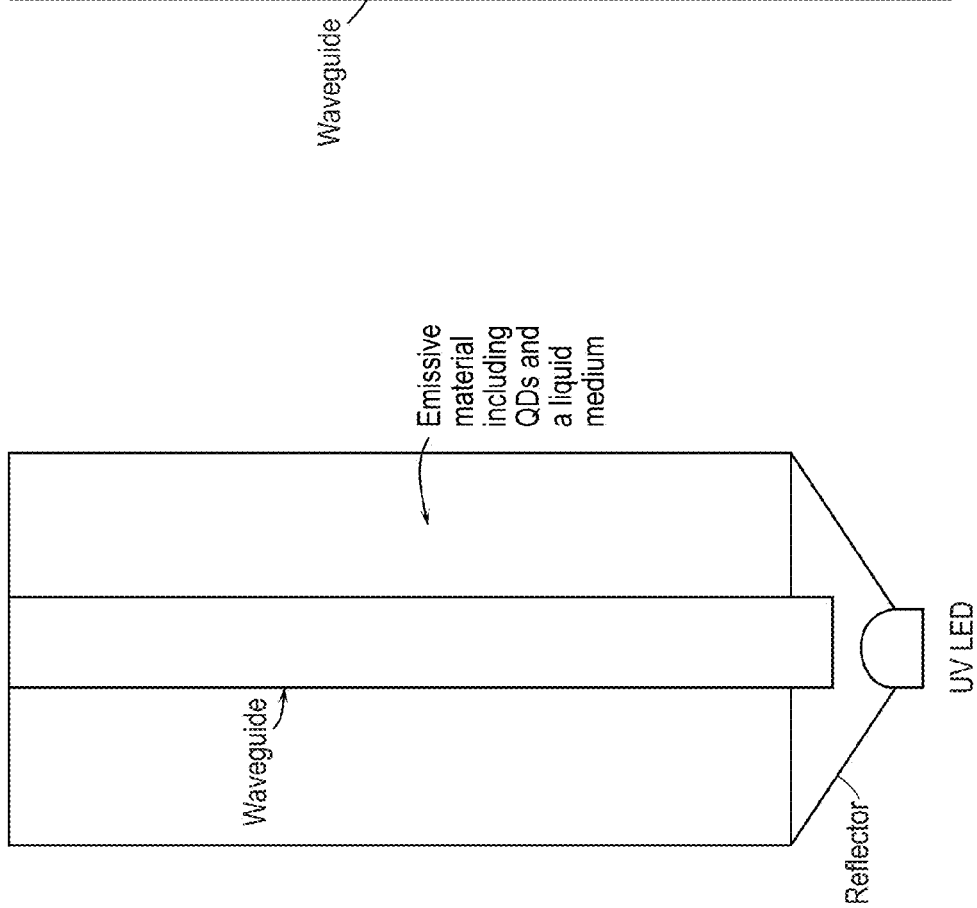
FIG. 1 is a drawing of an example of an embodiment of the present invention showing optical coupling of light from a light source (e.g., a UV LED) into a light guiding member included in vertical sealed chamber including an emissive material including QDs and a medium.

FIG. 1 is a drawing of an example of an embodiment of the present invention comprising a light transmissive tubular sealed container including a light guiding member (labeled as "waveguide"). As depicted, a major portion of the light guiding member is disposed within the sealed container, with an end portion thereof extending out of the sealed container for optical coupling with light from a light source (e.g., depicted as a "UV LED"). The depicted sealed tubular container is vertically oriented and includes an emissive material including QDs dispersed in a liquid medium disposed therein. A reflector is also positioned to reflect light from the light source into light guiding member, Other configurations and orientations of the sealed container are also contemplated to be within the scope of the present disclosure.

FIG. 2 is a photograph of a section of an embodiment of the present invention including a tubular container (e.g., an "outer tube") including a cylindrical light emitting member (e.g., "waveguide") disposed within. The outer tube has an outside diameter of about 1.75 inches, an inside diameter of about 1 inch (with a wall thickness of about ⅛ inch); the cylindrical light guiding member (or waveguide) has a diameter of about ½ inch.

Figure 3:
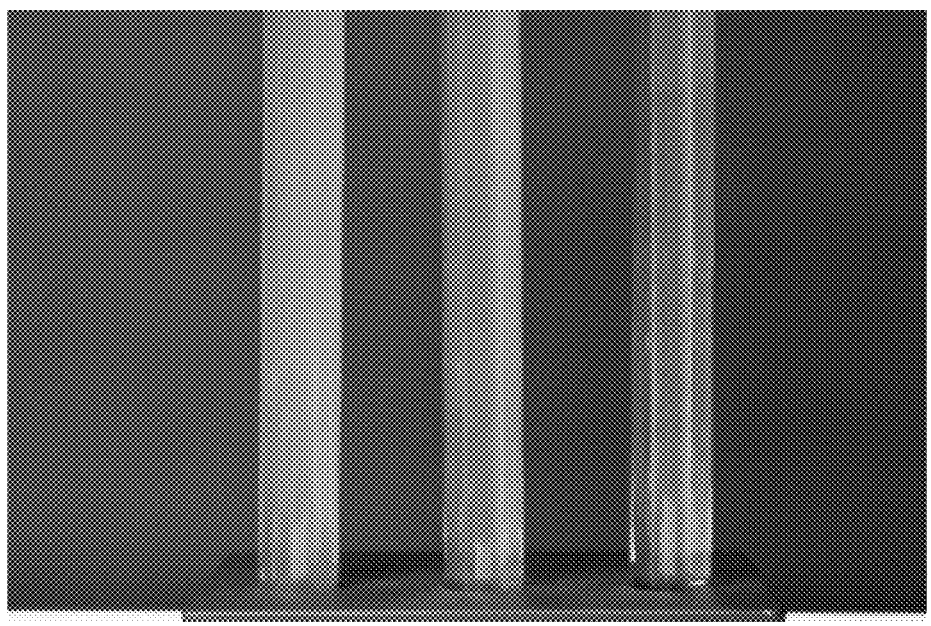
FIG. 3 depicts an image of lighting device in accordance with an embodiment of the invention including an acrylic tube that acts as a waveguide.
Figure 4:
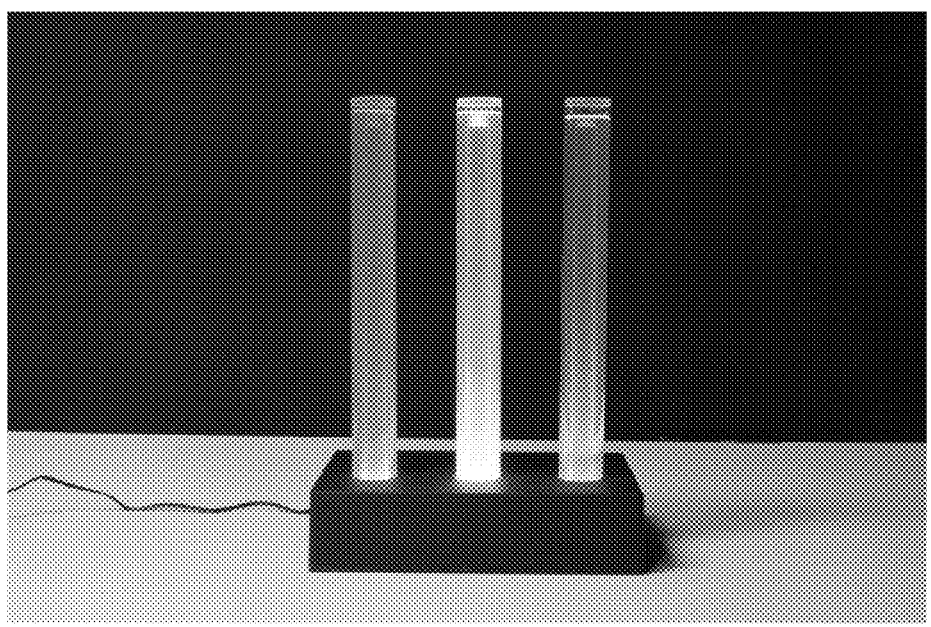
FIG. 4 depicts an image of lighting device in accordance with an embodiment of the invention including a sealed tube container including quantum dots in a liquid medium with an integrated light guiding member illuminated with light (e.g., from a UV source) from the bottom.

FIGS. 3 and 4 are photographs of three tubes (including, from left to right, a red light emitting emissive material, a green light emitting emissive material, and a blue light emitting emissive material) in accordance with an embodiment of the invention, each including a solid cylindrical acrylic light guiding member extending from the internal bottom surface of the outer sealed tubular container toward the top thereof. The light guiding member acts as a waveguide and improves the distribution of light from the light source through the sealed container so that the light produced by the lighting device can be more evenly or uniformly distributed along the length of the lighting device. In certain embodiments, an emissive material can include a liquid medium comprising mineral oil (having a refractive index of 1.47) and a light guiding member made from acrylic (having a refractive index of 1.49). Preferably, for waveguiding properties, the index of refraction of the material from which the light guiding member is constructed is greater than the index of refraction of the liquid medium in which the quantum dots are dispersed in the emissive material.

In a smaller diameter tubular sealed container, e.g., a capillary, the light guiding member can comprise a thin acrylic member (e.g., fishing line), a glass fiber, or other member having waveguiding capabilities and dimensions suitable for being disposed within the particular container.

FIGS. 3 and 4 depict images of a lighting device in accordance with an embodiment of the invention including a sealed tube container including quantum dots in a liquid medium with an integrated light guiding member.

FIG. 4 shows the lighting device illuminated with light (e.g., from a UV source) from the bottom.

Figure 5:
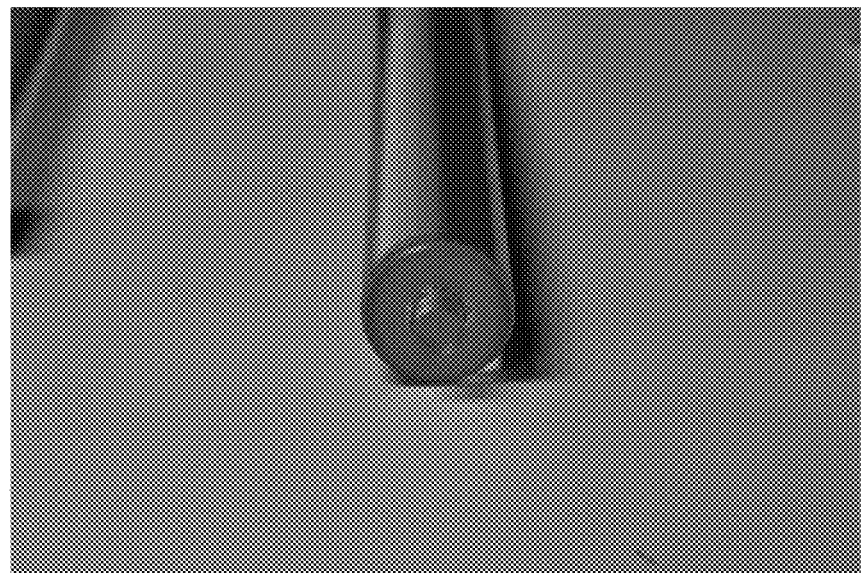
FIG. 5 shows an image showing one end of sealed tube container with a portion of the inner light guiding member extending therefrom.

FIG. 5 shows photograph of one end of sealed tube container with a portion of the inner light guiding member extending therefrom.

Figure 6:
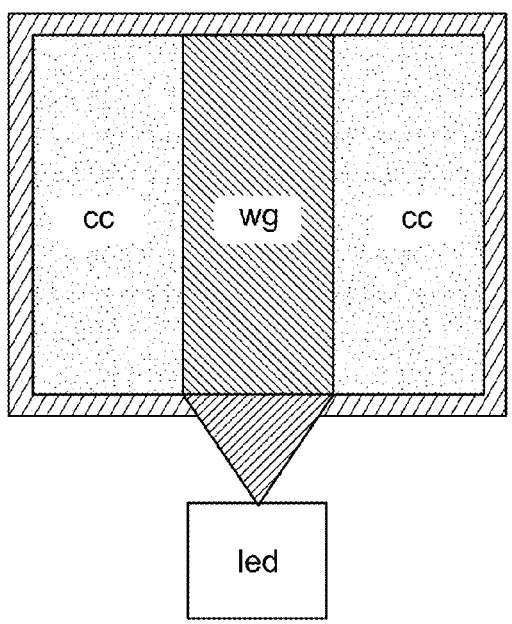
FIG. 6 depicts, in cross-section, a drawing of an example of an embodiment of a lighting device in accordance with the present invention.

FIG. 6 depicts, in cross-section, a drawing of an example of an embodiment of a lighting device in accordance with the present invention including a light guiding member of uniform refractive index inserted into a color conversion medium (emissive material) disposed within a sealed light transmissive container. Such configuration can be used to improve light distribution into the emissive material included in the sealed container along the length of a container. Preferably, in this configuration, the index of refraction of the waveguide can be increased with respect to the color conversion medium to improve transmission along the light guiding member (or waveguide). Preferably, the length of the light guiding member is selected to extend through the full length of the sealed container so light from the light source can be distributed over the full length of the container.

Figure 7:
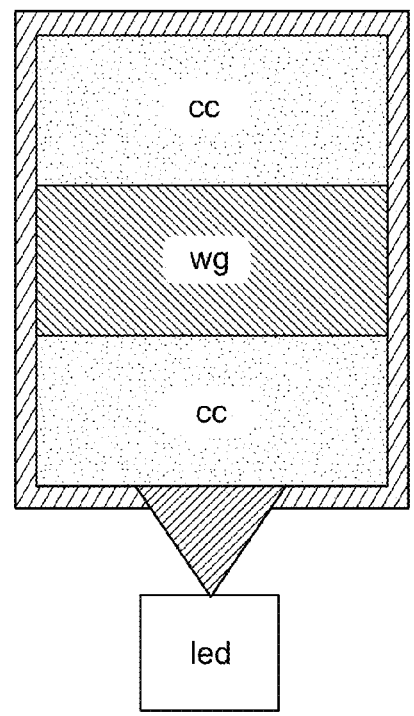
FIG. 7 depicts, in cross-section, a drawing of an example of another embodiment of a lighting device in accordance with the present invention.

FIG. 7 depicts, in cross-section, a drawing of an example of another embodiment of a lighting device in accordance with the present invention. In this example, the light source is orthogonal to the orientation of the waveguide. If the transmission length through the light guiding member is short, the index of refraction of the light guiding member (or waveguide) can be reduced or matched to that of the medium in the emissive material (or color conversion material) to improve outcoupling. In this case the waveguide is acting as an optical spacer and providing better light distribution orthogonal to the LED emitting direction.

Figure 8:
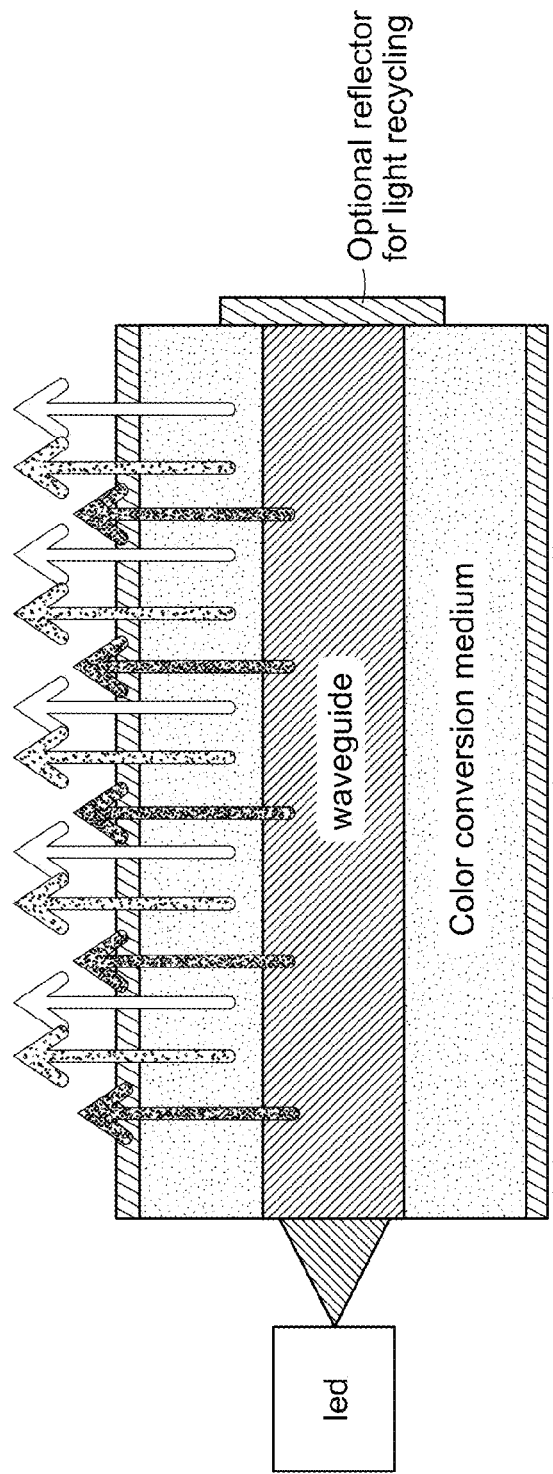
FIG. 8 depicts a cross-section drawing of an example of an embodiment of a lighting device in accordance with the present invention further including an optical reflector opposite the light source for light recycling.
Figure 9:
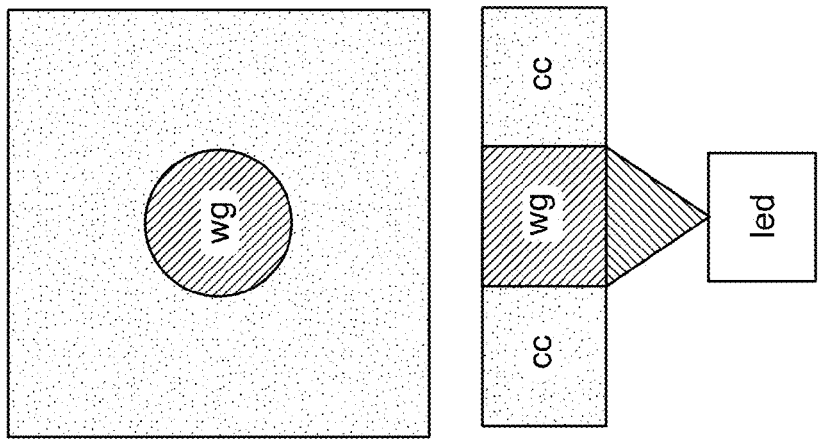
FIG. 9 depicts a cross-section drawing of an example of an embodiment of a lighting device in accordance with the present invention, and an cross section of an example of a sealed container including a light guiding member and an emissive material surrounding the external surface of the light guiding member within the sealed container.

FIG. 8 depicts a cross-section drawing of an example of an embodiment of a lighting device in accordance with the present invention further including an optical reflector opposite the light source for light recycling. Outcoupling from the light guiding member or waveguide can be achieved by evanescent coupling, scatterers, etching or roughening the waveguide surface to create a uniform light source. Light can be outcoupled from either side of the optic (only top shown above); Also an optional reflector can be added to create a single sided emitter. The LED can be centered on the waveguide to maximize waveguide coupling or off center to launch light directly into the color conversion medium FIG. 9 depicts a cross-section drawing of an example of an embodiment of a lighting device in accordance with the present invention, and an cross section of an example of a sealed container including a light guiding member (or waveguide) and an emissive material (cc) surrounding the external surface of the light guiding member within the sealed container. As discussed above, the light guiding member is preferentially clear or light transmissive (more preferably, highly transmissive). As depicted, "cc" comprises an emissive material containing quantum dots; and "led" comprises a light emitting diode.

Figure 10:
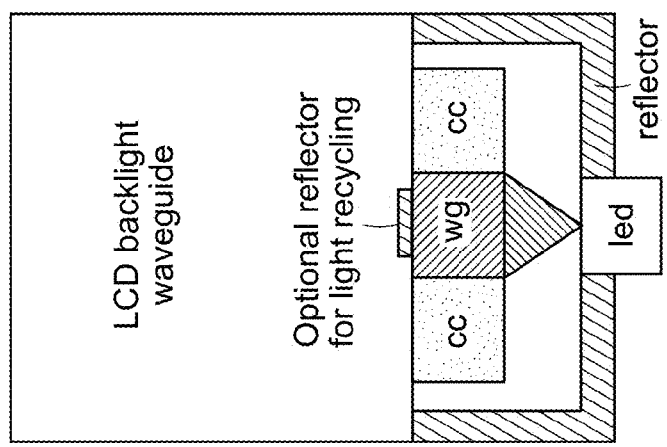
FIG. 10 depicts a cross-section drawing of an example of an embodiment of a lighting device in accordance with the present invention further optically coupled to the edge of a waveguide for a liquid crystal display backlight.

FIG. 10 depicts a cross-section drawing of an example of an embodiment of a lighting device in accordance with the present invention further optically coupled to the edge of a waveguide for a liquid crystal display backlight. As shown, the lighting device also includes two optional reflectors.

Figure 11:
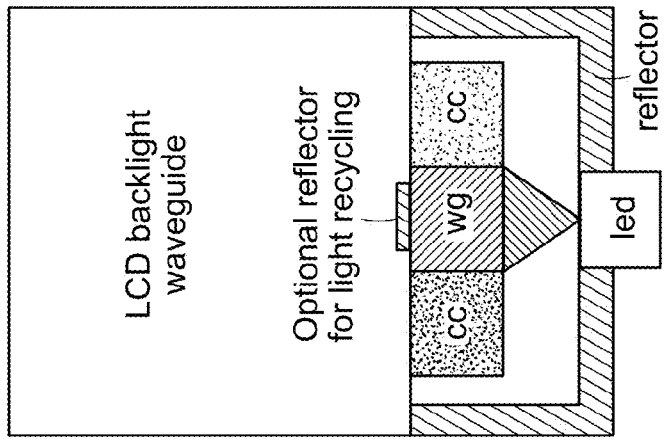
FIG. 11 depicts a cross-sectional drawing of an example of an embodiment of a lighting device in accordance with the present invention further optically coupled to the edge of a waveguide for a liquid crystal display backlight including optional reflectors.

FIG. 11 depicts a cross-sectional drawing of an example of an embodiment of a lighting device in accordance with the present invention further optically coupled to the edge of a waveguide for a liquid crystal display backlight including optional reflectors. In this embodiment, the incorporated waveguide serves as an efficient means of passing and/or distributing some blue light from a light source (e.g., LED) before coupling into the LCD backlight waveguide. Two separate regions of color conversion media surround the waveguide to minimize phosphor self-absorption effects.

Figure 12A:
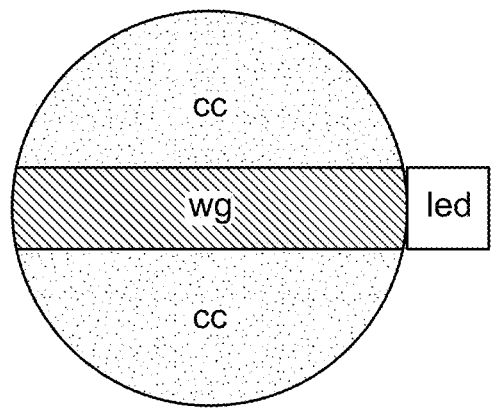
FIG. 12A depicts a top end view and FIG. 12B depicts a perspective view of an example of an embodiment of a lighting device in accordance with the present invention.
Figure 12B:
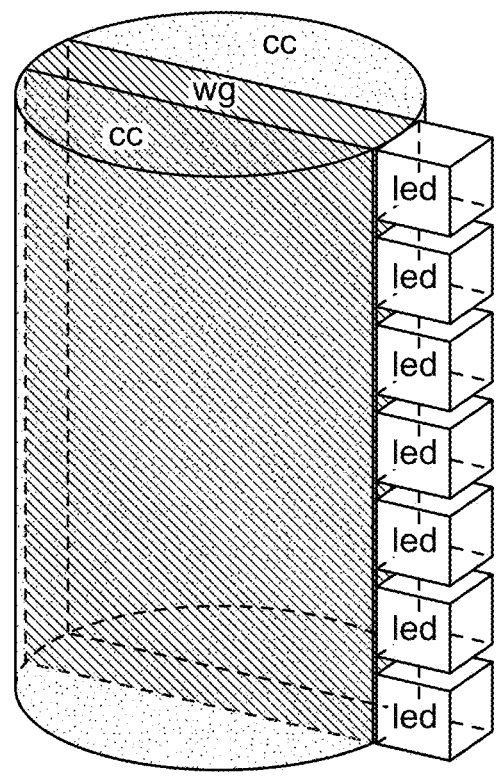

FIG. 12A provides a schematic cross-sectional top view of an example of an embodiment of a light-emitting device structure in accordance with the invention wherein the light source comprises a light strip including a plurality of light emitting devices (depicted as LEDs), the strip being optically coupled to the light guiding member along one of the side surfaces of the sealed container to which the light guiding member extends. FIG. 12B provides a schematic perspective view of the example of the embodiment shown in FIG. 12A.

Additional information that may be useful in connection with the present disclosure and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized Nanoparticles And Method"; each of the foregoing being hereby incorporated herein by reference in its entirety.

LEDs that can be useful as light sources within the scope of the present invention include any conventional LED such as those commercially available from Citizen, Nichia, Osram, Cree, or Lumileds. Useful light emitted from LEDs includes white light, off white light, blue light, green light, UV light, and any other light emitted from an LED.

Quantum dots are preferably handled in a controlled (oxygen-free and moisture-free) environment, preventing the quenching of luminescent efficiency during the fabrication process.

As used herein, "top", "bottom", "over", and "under" are relative positional terms, based upon a location from a reference point. More particularly, "top" means farthest away from a reference point, while "bottom" means closest to the reference point. Where, e.g., a second layer is described as disposed or deposited "over" a first layer on a substrate, the second layer is disposed farther away from substrate. There may be other layers between the first and second layers, unless it is otherwise specified. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A lighting device comprising: a sealed container at least a portion of which is light transmissive, the sealed container including a side wall and an end wall, which collectively define a hollow interior, at least one emissive material included within the hollow interior of the sealed container, the at least one emissive material comprising quantum dots dispersed in a liquid medium, and a light guiding member which extends from an internal surface of the side wall or the end wall of the sealed container into the hollow interior of the sealed container, the light guiding member being in contact with the liquid medium within the hollow interior of the sealed container, wherein the lighting device is adapted for optically coupling the light guiding member to a light source, wherein the light guiding member extends from the internal surface of one end surface of the sealed container to a second internal surface at the opposite end of the sealed container and also extends from a first internal side surface of the sealed container to a second internal side surface of the sealed container thereby forming two chambers separated by the light guiding member in the sealed container.

2. A lighting device in accordance with claim 1 wherein the lighting device is adapted such that light from the light source is externally optically coupled to the light guiding member.

3. A lighting device in accordance with claim 1 wherein the light guiding member is substantially perpendicular to the internal surface of the sealed container from which it extends.

4. A lighting device in accordance with claim 3 wherein the light guiding member extends along the center longitudinal axis of the sealed container.

5. A lighting device in accordance with claim 3 wherein the light guiding member extends along the center lateral axis of the sealed container.

6. A lighting device in accordance with claim 3 wherein the light source is optically coupled to the light guiding member in a direction orthogonal to the longitudinal direction of the light guiding member.

7. A lighting device in accordance with claim 3 wherein the light source is optically coupled into an end of the light guiding member.

8. A lighting device in accordance with claim 3 wherein the light guiding member extends along a longitudinal dimension of the sealed container parallel to the side wall of the sealed container.

9. A lighting device in accordance with claim 1 wherein the internal surface from which the light guiding member extends is the internal surface of an end surface of the sealed container.

10. A lighting device in accordance with claim 1 wherein the internal surface from which the light guiding member extends is the internal surface of an end surface of the sealed container and the light guiding member extends to an internal surface of the opposite end of the sealed container.

11. A lighting device in accordance with claim 1 wherein the internal surface from which the light guiding member extends is the internal surface of an end surface of the sealed container and wherein a second portion of the light guiding member extends through the end surface to the exterior of the sealed container.

12. A lighting device in accordance with claim 1 further including a light source optically coupled to the light guiding member.

13. A lighting device in accordance with claim 12 wherein the light source comprises one or more inorganic semiconductor light emitting devices.

14. A lighting device in accordance with claim 12 further including a reflector positioned to reflect emitted light from the light source to the light guiding member.

15. A lighting device in accordance with claim 1 wherein each of the chambers includes at least one emissive material comprising quantum dots disposed in a medium.

16. A lighting device in accordance with claim 1 wherein two symmetrical chambers are formed in the lighting device, the two chambers being separated by the light guiding member extending between ends of the sealed container.

17. A lighting device in accordance with claim 16 wherein the light source comprises a strip including plurality of light emitting devices, the strip being optically coupled to the light guiding member along one of the side surfaces of the sealed container to which the light guiding member extends.

18. A lighting device in accordance with claim 1 wherein one or more of the emissive materials is capable of converting a portion of light emitted by the light source to light having a maximum peak emission different from that of the light emitted by the light source.

19. A lighting device in accordance with claim 1 wherein the light guiding member has a refractive index greater than the refractive index of the medium.

20. A lighting device in accordance with claim 1 wherein the sealed container is hermetically sealed.

21. A lighting device in accordance with claim 1 wherein the sealed container is light transmissive.

22. A backlight unit including a lighting device in accordance with claim 1.

23. A liquid crystal display including a lighting device in accordance with claim 1.

24. A lighting system comprising a lighting device in accordance with claim 1 optically coupled to one or more light sources, wherein the light system further includes a reflector having a reflecting surface, the reflector being positioned and configured to reflect uncoupled light emission from the one or more light sources into the lighting device and to reflect light emission from the lighting device out of the lighting system.

25. A lighting device in accordance with claim 1 wherein the light guiding member includes a central core which extends from the internal surface of one end surface of the sealed container to a second internal surface at the opposite end of the sealed container, the central core including a preselected number of vanes that radiate from the central core along the length of the light guiding member to an internal side wall of the container, such that the light guiding member divides the interior of the sealed contained into a plurality of chambers that run the length of the sealed container, wherein each chamber includes an emissive material comprising quantum dots dispersed in a medium comprising a liquid, the emissive material having emissive characteristics that are the same as, or different from, any one or more of the emissive material included in any other of the plurality of chambers.

* * * * *